United States Patent
Zheng et al.

(10) Patent No.: US 8,493,693 B1
(45) Date of Patent: Jul. 23, 2013

(54) PERPENDICULAR MAGNETIC RECORDING TRANSDUCER WITH AFM INSERTION LAYER

(75) Inventors: Yuankai Zheng, Fremont, CA (US); Qunwen Leng, Palo Alto, CA (US); Mahendra Pakala, Fremont, CA (US); Cheng-Han Yang, Mountain View, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 13/436,694

(22) Filed: Mar. 30, 2012

(51) Int. Cl.
*G11B 5/127* (2006.01)

(52) U.S. Cl.
USPC .................................................. 360/324.11

(58) Field of Classification Search
USPC .................. 360/324.11, 324.1, 324.12, 324.2
See application file for complete search history.

(56) References Cited

U.S. PATENT DOCUMENTS

| | | | |
|---|---|---|---|
| 6,208,492 B1 | 3/2001 | Pinarbasi | |
| 6,222,707 B1 | 4/2001 | Huai et al. | |
| 6,710,985 B2 | 3/2004 | Noma | |
| 7,154,717 B2 | 12/2006 | Noma | |
| 7,352,543 B2 | 4/2008 | Li et al. | |
| 7,355,823 B2 | 4/2008 | Li et al. | |
| 7,446,982 B2 | 11/2008 | Gill | |
| 7,476,954 B2 | 1/2009 | Wang et al. | |
| 7,532,442 B2 * | 5/2009 | Gill | 360/324.11 |
| 7,554,775 B2 | 6/2009 | Li et al. | |
| 7,602,033 B2 * | 10/2009 | Zhao et al. | 257/427 |
| 7,646,568 B2 | 1/2010 | Zhang et al. | |
| 7,821,747 B2 * | 10/2010 | Gill | 360/324.2 |
| 7,872,837 B2 * | 1/2011 | Gill | 360/324.11 |
| 7,872,838 B2 | 1/2011 | Zhang et al. | |
| 2008/0032159 A1 | 2/2008 | Gill | |
| 2008/0299679 A1 * | 12/2008 | Zhao et al. | 438/3 |
| 2008/0316657 A1 * | 12/2008 | Zhang et al. | 360/324.11 |
| 2009/0194833 A1 | 8/2009 | Wang et al. | |
| 2011/0081558 A1 | 4/2011 | Lin | |

\* cited by examiner

*Primary Examiner* — Allen T Cao

(57) ABSTRACT

A magnetic sensor is configured to reside in proximity to a recording medium during use. The sensor includes a magnetic top shield and a magnetic bottom shield. A top sensor stack is under the magnetic top shield and includes magnetic sensing layers. A bottom sensor stack is between the magnetic bottom shield and the top sensor stack. The bottom sensor stack includes a magnetic seed stack above the bottom shield, an insertion stack above the magnetic seed stack, and an antiferromagnetic (AFM) layer on and in contact with the insertion stack. A pinned layer is above the AFM layer. An AFM coupling layer is above the pinned layer. In some aspects the insertion stack may include at least one of Ti, Hf, Zr, and Ta. In some aspect, the insertion stack includes a layer of elemental Ti. In other aspects, the insertion stack includes multilayer structures.

24 Claims, 3 Drawing Sheets

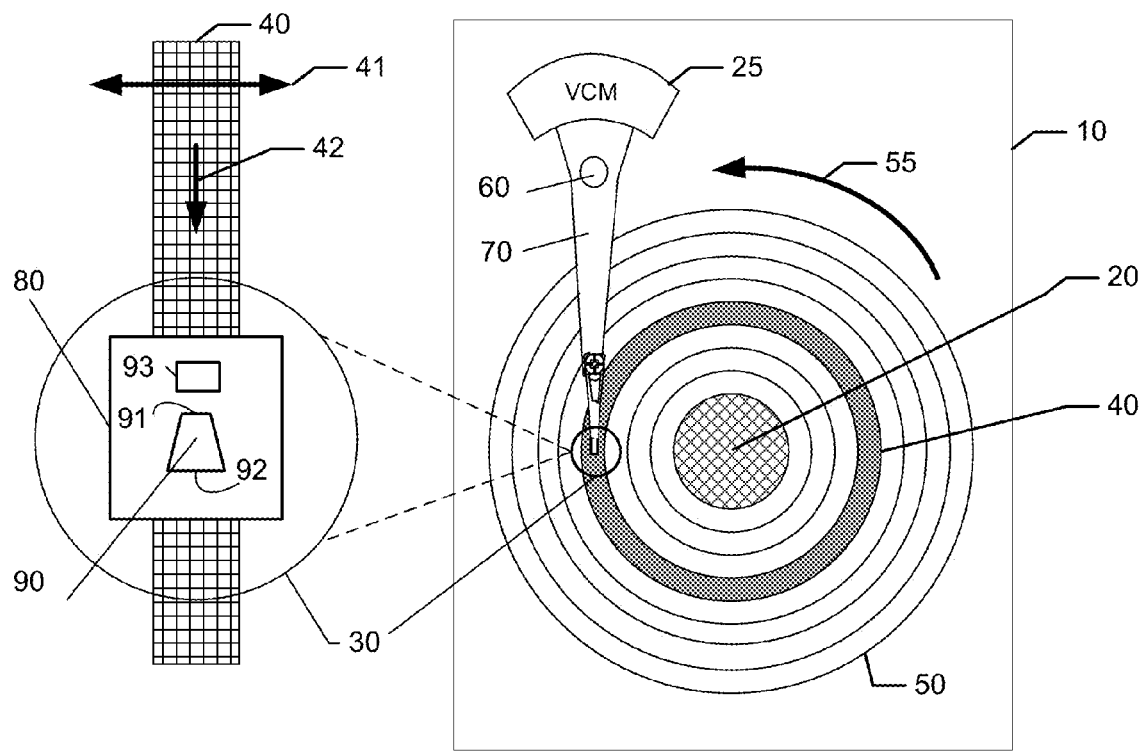
FIG. 1a  FIG. 1
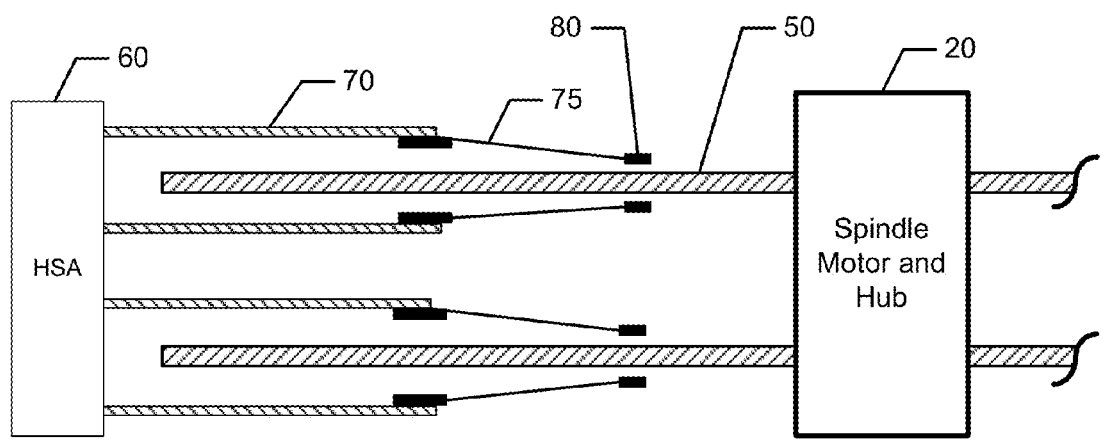
FIG. 2

PERPENDICULAR MAGNETIC RECORDING TRANSDUCER WITH AFM INSERTION LAYER

BACKGROUND OF THE INVENTION

Disk drives typically use heads residing on sliders to read from and write to the magnetic media. Read and write transducers residing in the head are flown at a small, controlled spacing above the magnetic medium (disk) during read and write operations. An air bearing forms between the head and the disk due to the disk rotating at high speeds to provide controlled head to disk spacing. Magnetic fields emanating from the write transducer pole tip switches magnetization of the magnetic medium, i.e., writing to the medium. Among other factors, a smaller and more tightly controlled magnetic writing field will allow more data to be written in the same space, thereby increasing areal density.

FIG. 1 illustrates a conventional disk drive 10 used for data storage. Figures are not drawn to scale and only certain structures are depicted for clarity. Disk media 50 is attached to spindle motor and hub 20. The spindle motor and hub 20 rotate the media 50 in a direction shown by arrow 55. Head Stack assembly (HSA) 60 includes a magnetic recording head 30 on actuator arm 70 and positions actuator arm 70 by positioning the voice coil motor (VCM) 25 over a desired data track, shown as recording track 40 in this example, to write data onto the media 50.

FIG. 1a illustrates an enlarged view of a section of FIG. 1 including head 30 and track 40. A magnetic recording transducer 90 is fabricated on slider 80. Slider 80 may be attached to suspension 75 and suspension 75 may be attached to actuator arm 70 as shown in FIG. 2. A read transducer 93 is also fabricated on slider 90.

Referring again to FIG. 1a, Slider 80 is illustrated above recording track 40. Media 50 and track 40 are moving under slider 80 in an in-track direction shown by arrow 42. The cross-track direction is shown by arrow 41.

The magnetic recording transducer 90 has a leading edge 91 and a trailing edge 92. In this embodiment, the trailing edge 92 of recording transducer 90 is the final portion of magnetic transducer 90 that writes onto the recording track 40 as the media moves under the slider 80 in direction 42.

FIG. 2 illustrates a side view of the disk drive 10 shown in FIG. 1. At least one disk media 50 is mounted onto spindle motor and hub 20. HSA 60 comprises at least one actuator arm 70 that carries suspension 75 and slider 80. Slider 80 has an air bearing surface (ABS) facing media 50. When the media is rotating and actuator arm 70 is positioned over the media 50, slider 80 floats above media 50 by aerodynamic pressure created between the slider ABS and the surface of media 50 facing the ABS of slider 80.

BRIEF DESCRIPTION OF THE DRAWINGS

FIGS. 1 and 1a illustrate a top view of conventional hard disk drive,

FIG. 2 illustrates a side view of a conventional hard disk drive

DETAILED DESCRIPTION OF THE INVENTION

In the following detailed description, numerous specific details are set forth to provide a full understanding of the present invention. It will be apparent, however, to one ordinarily skilled in the art that the present invention may be practiced without some of these specific details. In other instances, well-known structures and techniques have not been shown in detail to avoid unnecessarily obscuring the present invention.

Figure 3:
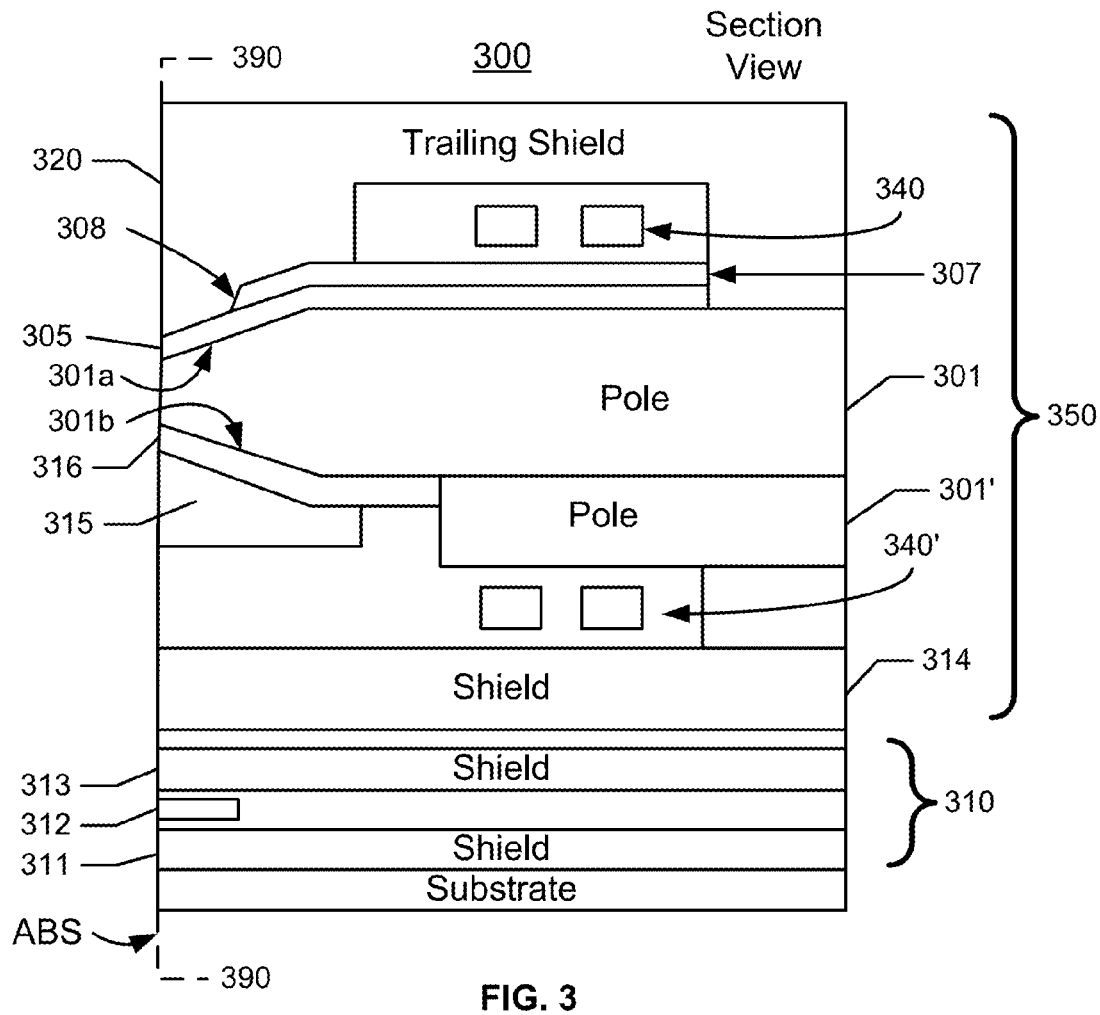
FIG. 3 illustrates a section of a side view of a section of a perpendicular magnetic head in accordance with one aspect of the subject invention.

FIG. 3 illustrates an embodiment of the invention in a side section view of read/write transducer 300 incorporating a write transducer 350 and read sensor 310 at ABS 390. The read sensor 310 may include shields 311 and 313 as well as sensor 312. Write transducer 350 includes shield 314, main pole 301, assist pole 301', coils 340 and 340', and trailing shield 320. Main pole 301 has trailing bevel 301a. Write transducer 350 may also include underlayer or optional leading shield 315, nonmagnetic layer 316, first gap layer 305, and second gap layer 307. Second gap layer 307 may have recessed edge 308. Other and/or different components may be fabricated in other embodiments. For example, optional leading shield 315 may be included. In addition, main pole 301 is shown including optional leading edge bevel 301b. However, in some embodiments, the bevel 301b may be omitted. In some embodiments, coupling layers, stop layers and/or seed layers may also remain between layers as part of the fabrication process. In another embodiment, shield 313 and shield 314 may be combined into a single shared shield.

Figure 4:
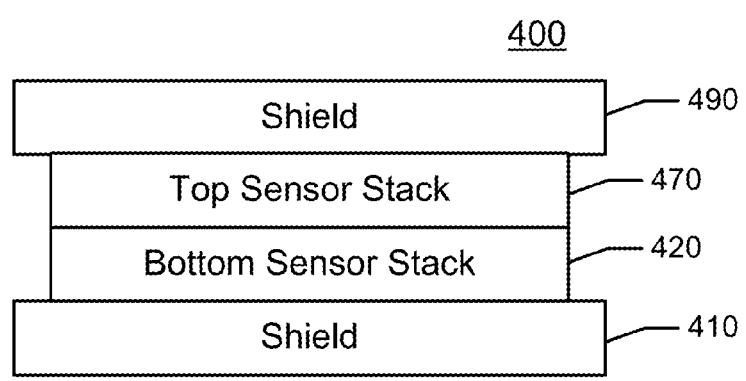
FIG. 4 illustrates an ABS view of a section of a perpendicular magnetic head sensor in accordance with one aspect of the subject invention.

FIG. 4 illustrates an embodiment of a read sensor section 400 of read sensor 400 shown in view from the ABS. A bottom sensor stack 420 and top sensor stack 470 reside between bottom shield 410 and top shield 490.

Figure 5:
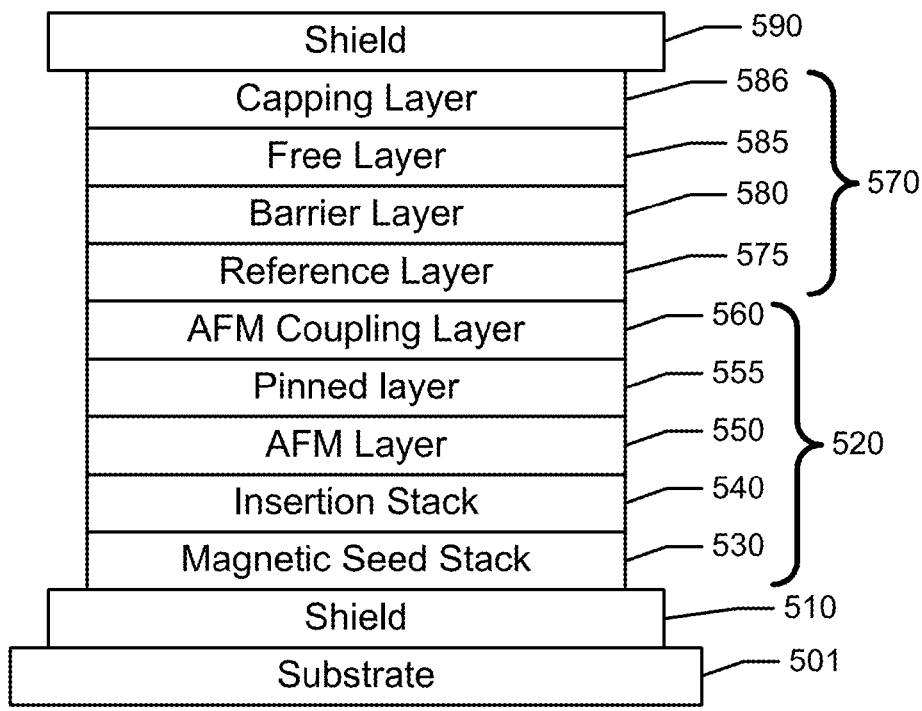
FIG. 5 illustrates a sectional view of a magnetic recording sensor in accordance with one aspect of the subject invention.

FIG. 5 illustrates a read sensor 500. Bottom shield 510 resides on a substrate 501. The substrate may be any suitable underlayer and may include, for example, alumina (AlOx). Bottom shield 510 may comprise soft magnetic material. A bottom sensor stack 520 is above bottom shield 510, and a top sensor stack 570 is above bottom sensor stack 520. The division between the layers comprising bottom sensor stack 520 and top sensor stack 570 is for convenience of description and clarity, and are not intended to define strict functional separations. The top sensor stack 570 mainly comprises magnetic sensing layers and works in cooperation with the bottom sensor stack 520. A top shield 590 is above top sensor stack 570. Top shield 590 may comprise soft magnetic material.

Bottom sensor stack 520 comprises magnetic seed stack 530, insertion stack 540, antiferromagnetic (AFM) layer 550, pinned layer 555, and AFM coupling layer 560.

Magnetic seed stack 530 is provided to enhance grain growth of layers to be provided above, and may comprise soft magnetic material. In one embodiment, magnetic seed stack 530 is a single layer, and in another embodiment, magnetic seed stack 530 comprises multiple layers. As recording density increases, a reduction of the spacing between bottom shield 510 and top shield 590 (shield to shield spacing) is required; however, as a result of narrower track widths and decreased shield to shield spacing the AFM layer 550 volume become smaller. The smaller volume of AFM layer 550 reduces its pinning strength; and thermal stability of the pinned layer 555 is degraded as the AFM layer 550 volume decreases. Larger grain size or higher anisotropic energy or both can be improved to maintain or control stability. In one aspect of the invention, AFM layer 550 comprises IrMn. The magnetic seed stack 530 promotes both the grain size and orientation. It is desired, however, to decouple the magnetic seed stack 530 from the AFM layer 550. A thin (e.g., 1 nm) layer of Ruthenium (Ru) is useful for this purpose; however as the AFM layer 550 volume decreases, its thermal stability is undesirably reduced and the thickness and properties of Ru become limiting factors for maintaining thermal stability of the volume-reduced AFM layer 550. A need therefore exists for an improved decoupling layer between the magnetic seed 530 and the AFM layer 550. Insertion stack 540 provides advantages that allow a reduced thickness of the AFM layer 550, and also provides a reduction of thickness between the magnetic seed stack 530 and the AFM layer 550.

Continuing the description of bottom sensor stack 520, pinned layer 555 is above AFM layer 550 and may comprise, for example, CoFe or CoFeB. The AFM layer 550 stabilizes the pinned layer 555. The magnetization (not shown) of pinned layer 555 is substantially fixed, or pinned. AFM coupling layer 560 is above pinned layer and 555 and provides magnetic coupling from the pinned layer 555 to layers above, and may comprise, for example, Ru. In one aspect of the invention, AFM coupling layer 560 may have a thickness less than 0.9 nm.

Top sensor stack 570 is above bottom sensor stack 520 and comprises magnetic sensing layers. In one aspect of the invention top sensor stack 570 comprises reference layer 575, barrier layer 580, free layer 585, and capping layer 586. Reference layer 575 is above AFM decoupling layer 560. A barrier layer 580 is above reference layer 575 and a free layer 585 above barrier layer 580. A capping layer 586 is above free layer 585. Barrier layer 580 has a resistance that varies in response to the relative magnetic orientation to the reference layer 575 below, and the free layer 585 above. The orientation of free layer 585 may move, or switch, in response to an external field such as that from and magnetic recording medium. A sense current is passed between bottom shield 510 and top shield 590; and as the magnetic field from the recording medium passes the free layer 585, the resistance changes, and that has an affect on the sense current, which may be used to provide an electrical signal.

In one aspect of the invention, reference layer 575 comprises CoFeB. In another aspect, barrier layer 580 comprises MgO; and in a further aspect the free layer 585 may comprise NiFe. Capping layer 586 may comprise a plurality of layers, and may comprise Ta.

Figure 6:
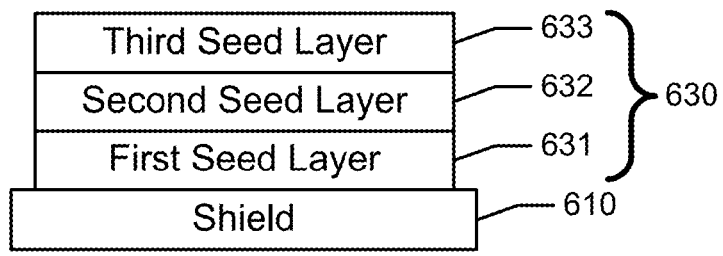
FIG. 6 illustrates a seed layer stack in accordance with several embodiments of the invention.

FIG. 6 illustrates underlayers 600 that comprises magnetic seed stack 630 on top of bottom shield 610. Magnetic seed stack 630 comprises first seed layer 631, second seed layer 632, and third seed layer 633. Multiple seed layers are used to provide desirable characteristics to promote grain formation on layers above. In one embodiment of the invention, the magnetic seed stack 630 comprises at least one of Co, Ni, B, and Fe. In one aspect of the invention, the magnetic seed stack 630 comprises a multilayer stack, wherein a first seed layer 631 is above the bottom shield 610 and comprises CoFeB, a second seed layer 632 is on the first seed layer 631 and comprises NiFe50, and a third seed layer 633 is on the second seed layer 632 and comprises NiFe5.

Figure 7:
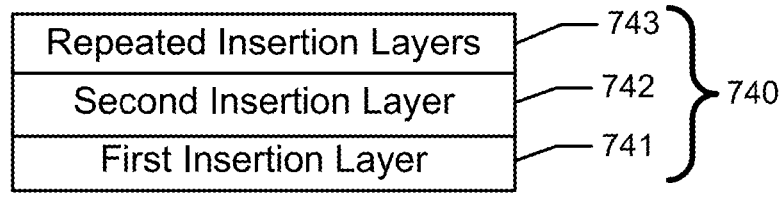
FIG. 7 illustrates an insertion layer stack in accordance with several embodiments of the invention.

FIG. 7 illustrates an insertion stack 740 that provides magnetic decoupling between the magnetic seed stack 530 and the AFM layer 550. Insertion stack 740 may comprise a single layer or multi-layer structure. FIG. 7 illustrates Insertion stack 740 comprising first insertion layer 741 and second insertion layer 742. First insertion layer 741 and second insertion layer 742 may be repeated in the same order a plurality of times, and is illustrated as repeated insertion layers 743. In one embodiment, first insertion layer 741 comprises Ti, and second insertion layer 742 comprises Ru. In one aspect, the layers may be reversed; i.e., the first insertion layer may comprise Ru and the second layer may comprise Ti. In another embodiment, repeated insertion layers 743 may comprise repeated alternating layers of the first insertion layer 741 material and second insertion layer 742 materials (both not shown).

In one embodiment, insertion stack 740 comprises a single layer of elemental Ti. As the insertion layer 740 becomes thicker, it may cause AFM layer 550 to become amorphous. In one embodiment of the invention, insertion stack 740 has a thickness between 0.1 nm and 0.5 nm. In another embodiment, insertion stack 740 comprises an amorphous alloy of at least one of Ti, Hf, Zr, and Ta. In a further embodiment, insertion stack 740 comprises a plurality of layers, at least one layer comprising at least one of Ti, Hf, Zr, and Ta; and at least one of the plurality of layers comprise at least one of Ru, Ir, and Pt.

In another embodiment of the invention, insertion stack 740 comprises a layer of elemental Ti, and has a thickness of insertion stack 740 between 0.1 nm and 0.5 nm; and AFM layer 550 comprises IrMn having a thickness between 3 nm and 7 nm. In one aspect of the invention, AFM layer 550 has a thickness less than 5.5 nm.

In one embodiment of the invention, a disk drive may comprise a slider including a magnetic sensor configured to reside in proximity to a recording medium during use. The magnetic sensor may comprise a magnetic top shield and a magnetic bottom shield. A top sensor is stack positioned under the magnetic top shield, and the top sensor stack comprises magnetic sensing layers. A bottom sensor stack is positioned between the magnetic bottom shield and the top sensor stack. The bottom sensor stack comprises a magnetic seed stack positioned above the magnetic bottom shield, an insertion stack above the magnetic seed stack, and an antiferromagnetic (AFM) layer on and in contact with the insertion stack. A pinned layer is above the AFM layer, and an AFM coupling layer is above the AFM layer. The insertion stack comprises at least one of Ti, Hf, Zr, and Ta.

The previous descriptions employ a read sensor that is referred to as a current-perpendicular-to-plane (CPP) sensor. In conventional CPP sensors, sense current flows between a bottom shield and a top shield (i.e., through the layers of the stack). a CPP sensor stack may be formed using giant magnetoresistive (GMR) or tunneling magnetoresistive (TMR) structures. In other embodiments, the invention may be embodied in a current-in-plane (CIP) sensor. In CIP sensors, the sense current flows across the layers of the stack. CIP sensors are typically GMR type. CPP and CIP structures, as well as TMR and GMR sensors are well known to those of ordinary of skill in the art, and the present invention may be practiced in any of these structures.

The description of the invention is provided to enable any person skilled in the art to practice the various embodiments described herein. While the present invention has been particularly described with reference to the various figures and embodiments, it should be understood that these are for illustration purposes only and should not be taken as limiting the scope of the invention.

There may be many other ways to implement the invention. Various functions and elements described herein may be partitioned differently from those shown without departing from the spirit and scope of the invention. Various modifications to these embodiments will be readily apparent to those skilled in the art, and generic principles defined herein may be applied to other embodiments. Thus, many changes and modifications may be made to the invention, by one having ordinary skill in the art, without departing from the spirit and scope of the invention.

A reference to an element in the singular is not intended to mean "one and only one" unless specifically stated, but rather "one or more." The term "some" refers to one or more. Underlined and/or italicized headings and subheadings are used for convenience only, do not limit the invention, and are not referred to in connection with the interpretation of the description of the invention. All structural and functional equivalents to the elements of the various embodiments of the invention described throughout this disclosure that are known or later come to be known to those of ordinary skill in the art are expressly incorporated herein by reference and intended to be encompassed by the invention. Moreover, nothing disclosed herein is intended to be dedicated to the public regardless of whether such disclosure is explicitly recited in the above description.

We claim:

1. A magnetic sensor configured to reside in proximity to a recording medium during use, the magnetic sensor comprising:
   a magnetic top shield and a magnetic bottom shield;
   a top sensor stack positioned under the top shield;
      the top sensor stack comprising magnetic sensing layers;
   a bottom sensor stack positioned between the magnetic bottom shield and the top sensor stack, wherein the bottom sensor stack comprises:
      a magnetic seed stack positioned above the magnetic bottom shield;
      an insertion stack above the magnetic seed stack;
      an antiferromagnetic (AFM) layer on and in contact with the insertion stack;
      a pinned layer above the AFM layer, and
      an AFM coupling layer above the pinned layer,
      wherein the insertion stack comprises at least one of Ti, Hf, Zr, and Ta.

2. The magnetic sensor of claim 1 wherein the insertion stack comprises a layer of elemental Ti.

3. The magnetic sensor of claim 1 wherein the thickness of the insertion stack is between 0.1 nanometers (nm) and 0.5 nm.

4. The magnetic sensor of claim 1 wherein the insertion stack comprises an amorphous alloy of at least one of Ti, Hf, Zr, and Ta.

5. The magnetic sensor of claim 1 wherein the insertion stack comprises a plurality of layers.

6. The magnetic sensor of claim 5 wherein the insertion stack comprises at least one layer comprising at least one of Ru, Ir, and Pt.

7. The magnetic sensor of claim 1 wherein the AFM layer comprises IrMn.

8. The magnetic sensor of claim 7 wherein the AFM layer has a thickness of less than 7 nm.

9. The magnetic sensor of claim 1 wherein the insertion stack comprises a layer of elemental Ti and has a thickness between 0.2 nm and 1 nm, and the AFM layer comprises IrMn and has a thickness between 3 nm and 7 nm.

10. The magnetic sensor of claim 1 wherein the AFM layer has a thickness of less than 5.5 nanometers.

11. The magnetic sensor of claim 1 wherein the magnetic sensing layers comprise:
   a reference layer above the AFM coupling layer;
   a barrier layer above the reference layer;
   a free layer above the barrier layer, and
   a capping layer above the free layer.

12. The magnetic sensor of claim 11 wherein the reference layer comprises CoFeB.

13. The magnetic sensor of claim 11 wherein the barrier comprises MgO.

14. The magnetic sensor of claim 11 wherein the capping layer comprises Ta.

15. The magnetic sensor of claim 1 wherein the magnetic seed stack comprises at least one of Co, Ni, B, and Fe.

16. The magnetic sensor of claim 1 wherein the magnetic seed stack comprises a multilayer stack, wherein:
   a first seed layer comprising CoFeB is above the bottom shield;
   a second seed layer comprising NiFe50 is on the first seed layer, and
   a third seed layer comprising NiFe5 is on the second seed layer.

17. A disk drive comprising:
   a slider including a magnetic sensor configured to reside in proximity to a recording medium during use, the magnetic sensor comprising:
      a magnetic top shield and a magnetic bottom shield;
      a top sensor stack positioned under the top shield;
         the top sensor stack comprising magnetic sensing layers;
      a bottom sensor stack positioned between the magnetic bottom shield and the top sensor stack, wherein the bottom sensor stack comprises:
         a magnetic seed stack positioned above the magnetic bottom shield;
         an insertion stack above the magnetic seed stack;
         an antiferromagnetic (AFM) layer on and in contact with the insertion stack;
         a pinned layer above the AFM layer, and
         an AFM coupling layer above the pinned layer,
         wherein the insertion stack comprises at least one of Ti, Hf, Zr, and Ta.

18. The disk drive of claim 17 wherein the thickness of the insertion stack is between 0.1 nanometers (nm) and 0.5 nm.

19. The disk drive of claim 17 wherein the insertion stack comprises an amorphous alloy of at least one of Ti, Hf, Zr, and Ta.

20. The disk drive of claim 17 wherein the insertion stack comprises a plurality of layers, at least one layer comprising at least one of Ti, Hf, Zr, and Ta.

21. The disk drive of claim 20 wherein the insertion stack comprises a plurality of layers, at least one layer comprising at least one of Ru, Ir, and Pt.

22. The disk drive of claim 17 wherein the AFM layer comprises IrMn and has a thickness of less than 7 nm.

23. The disk drive of claim 17 wherein the insertion stack comprises a layer of elemental Ti and has a thickness between 0.2 nm and 1 nm, and the AFM layer comprises IrMn and has a thickness between 3 nm and 7 nm.

24. The disk drive of claim 17 wherein the AFM layer has a thickness of less than 5.5 nanometers.

* * * * *